United States Patent
van den Heuvel

(10) Patent No.: US 11,336,314 B2
(45) Date of Patent: May 17, 2022

(54) RF TRANSMITTER

(71) Applicant: Stichting IMEC Nederland, Eindhoven (NL)

(72) Inventor: Johan van den Heuvel, Geldrop (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 17/089,921

(22) Filed: Nov. 5, 2020

(65) Prior Publication Data
US 2021/0194516 A1 Jun. 24, 2021

(30) Foreign Application Priority Data

Dec. 20, 2019 (EP) .................................... 19218401

(51) Int. Cl.
| | | |
|---|---|---|
| H04B 1/04 | (2006.01) | |
| H04B 1/22 | (2006.01) | |
| H04B 1/7105 | (2011.01) | |
| H04B 1/30 | (2006.01) | |

(52) U.S. Cl.
CPC ............. H04B 1/04 (2013.01); H04B 1/22 (2013.01); H04B 1/7105 (2013.01); *H04B 2001/0433* (2013.01); *H04B 2001/305* (2013.01)

(58) Field of Classification Search
CPC .......... H04B 1/04; H04B 1/22; H04B 1/7105; H04B 2001/0433; H04B 2001/305
See application file for complete search history.

(56) References Cited

U.S. PATENT DOCUMENTS

| | | |
|---|---|---|
| 8,571,134 B2 | 10/2013 | Pavlovic et al. |
| 9,270,509 B1 | 2/2016 | Agon |
| 2007/0189417 A1* | 8/2007 | Waheed ............... H04L 7/005 375/300 |
| 2012/0242383 A1* | 9/2012 | Elad ..................... H03L 7/06 327/156 |
| 2013/0187688 A1 | 7/2013 | Wang et al. |
| 2013/0188749 A1 | 7/2013 | Wang et al. |
| 2013/0301754 A1 | 11/2013 | Staszewski et al. |

FOREIGN PATENT DOCUMENTS

WO 94/06204 A1 3/1994

OTHER PUBLICATIONS

Extended European Search Report and Written Opinion, EP Application No. 19218401.8, dated Jun. 4, 2020, 7 pages.

(Continued)

*Primary Examiner* — Janice N Tieu
(74) *Attorney, Agent, or Firm* — McDonnell Boehnen Hulbert & Berghoff LLP

(57) ABSTRACT

A radio frequency, RF, transmitter, comprises a digitally controlled oscillator, DCO, configured to generate an RF signal; and digital modulation circuitry connected to the DCO for modulation of the RF signal, and driven by an RF clock signal derived from the RF signal, wherein the digital modulation circuitry comprises a module configured to apply a compensation for modulation jitter due to the modulation circuitry being driven by the RF clock signal and a compensation for DCO non-linearity.

23 Claims, 2 Drawing Sheets

(56) References Cited

OTHER PUBLICATIONS

Sarma Gunturi, Jawaharlal Tangudu, Sthanunathan Ramakrishnan, Jayawardan Janardhanan, Debapriya Sahu, and Subhashish Mukherjee; "Principal architectural changes in polar transmitter in DRP design for WLAN," In 2013 National Conference on Communications (NCC), pp. 1-5. IEEE, 2013.

Ba, Ao et al., A 1.3 nJ/b IEEE 802.11ah Fully Digital Polar Transmitter for IoE Applications, ISSCC 2016, Session 26, Wireless for IoE 26.3. 2016 IEEE International Solid-State Circuits Conference; Feb. 3, 2016; (3 pages including pp. 440 and 441).

Ba, Ao et al., A 0.62nJ/b multi-standard WiFi/BLE wideband digital polar TX with dynamic FM correction and AM alias suppression for IoT applications; 2018 IEEE Radio Frequency Integrated Circuits Symposium; 2018; pp. 308-311.

* cited by examiner

RF TRANSMITTER

CROSS-REFERENCE TO RELATED APPLICATIONS

The present application is a non-provisional patent application claiming priority to European Patent Application No. EP 19218401.8, filed Dec. 20, 2019, the contents of which are hereby incorporated by reference.

FIELD OF THE DISCLOSURE

This disclosure relates to a radio frequency (RF) transmitter and to a method of generating a digitally-modulated RF signal.

BACKGROUND

Standards such as an Institute of Electrical and Electronics Engineers, IEEE, 802.11b/g/n standard pose stringent error vector magnitude (EVM) and spectral mask requirements in, for example, wideband orthogonal frequency division multiplexing (OFDM) transmission. To meet such requirements, digitally-modulated RF transmitters, such as polar transmitters, may require oversampling in the digital modulation circuitry of data to be modulated, typically more than ten times the modulation data symbol rate. Such oversampling of the data, and anti-alias filtering, may result in sharp phase transitions at a high rate. These fast phase transitions require a polar transmitter to have a large frequency swing, for example up to +/−100 megahertz (MHz). To generate the required high-frequency clock signals, additional hardware is required, typically additional phase-locked loops (PLLs).

Document S. Gunturi, J. Tangudu, S. Ramakrishnan, J. Janardhanan, D. Sahu and S. Mukherjee, "Principal architectural changes in polar transmitter in DRP design for WLAN," 2013 National Conference on Communications (NCC), New Delhi, India, 2013, pp. 1-5. discloses a polar transmitter wherein the sampling frequency used for the digital logic is a data modulated clock output from the DCO, and wherein a predistortion mechanism is applied to the phase trajectory.

SUMMARY

This description pertains to providing a digitally-modulated RF transmitter, such as a wideband polar OFDM RF transmitter, capable of meeting strict EVM and spectral mask requirements with low power consumption.

In a first implementation, a radio frequency, RF, transmitter is provided. The RF transmitter comprises a digitally controlled oscillator, DCO, configured to generate an RF signal; and digital modulation circuitry connected to the DCO for modulation of the RF signal, and driven by an RF clock signal derived from the RF signal. The digital modulation circuitry comprises a module configured to apply a compensation for modulation jitter due to the modulation circuitry being driven by the RF clock signal and a compensation for DCO non-linearity.

The term "RF transmitter" should be understood to include any signal generator configured to generate an RF signal, regardless of whether, or not, it comprises, e.g., a power amplifier or an antenna.

The digital modulation circuitry being driven by an RF clock derived from the RF signal omits the need for additional clock generation circuitry for the digital modulation circuitry, for example in the form of an additional phase-locked loop (PLL). This saves circuit complexity, and thereby power.

However, this means that the clock that modulates the DCO is also derived from the DCO itself, resulting in that when the DCO frequency goes up the data is clocked faster into the DCO and when the DCO frequency goes down the data is clocked slower into the DCO. This effect causes modulation jitter, i.e., a modulation-data-dependent phase error which may, for example, worsen the EVM. This effect may be compensated for through the module configured to apply a compensation for modulation jitter due to the modulation circuitry being driven by the RF clock signal and a compensation for DCO non-linearity. Moreover, since the same module is configured to apply the compensation for modulation jitter and the compensation for DCO non-linearity, no additional circuitry for applying the compensation for modulation jitter may be required. This further saves on circuit complexity, and thereby power.

According to at least some of the example embodiments, the compensation for modulation jitter and the compensation for DCO non-linearity are applied to a capacitor control of the DCO. Hereby, for example, an already existing frequency linearization module in the digital modulation circuitry may be re-used for this purpose.

According to at least some of the example embodiments, the compensation for modulation jitter can be written as a frequency compensation factor $$\alpha = \frac{F_{RF}}{F_{RF} - F_{control}}$$

wherein $F_{RF}$ is a nominal RF frequency for the DCO and $F_{control}$ is a deviation from the nominal RF frequency to which the DCO is modulated.

According to at least some of the example embodiments, the compensation for modulation jitter and the compensation for DCO non-linearity are applied in a single step.

According to at least some of the example embodiments, the DCO non-linearity comprises an LC non-linearity, i.e., a non-linearity due to the resonant frequency of an LC circuit being proportional to the inverse of the square root of the product of the circuit capacitance and the circuit inductance.

According to at least some of the example embodiments, the compensation for modulation jitter and the compensation for DCO non-linearity can be written as a capacitance compensation factor $$c(m) = \frac{1 - 4\pi^2 LC(F_{RF} + \alpha(m)mdF)^2}{4\pi^2 LdCm(F_{RF} + \alpha(m)mdF)^2},$$

wherein $$\alpha(m) = \frac{F_{RF}}{F_{RF} - mdF},$$

wherein $F_{RF}$ is a nominal RF frequency for the DCO, m represents a number of connected capacitors, L is a DCO LC circuit inductance, C is a DCO LC circuit capacitance, dC is a switchably connectable capacitance, and dF is a fixed frequency step.

According to at least some of the example embodiments, the capacitor control is a capacitor control code of the DCO.

According to at least some of the example embodiments, the digital modulation circuitry is configured for polar modulation of the RF signal.

According to at least some of the example embodiments, the digital modulation circuitry is configured to oversample the RF signal to be modulated.

In a second implementation a method of generating a digitally-modulated a radio frequency, RF, signal, using an RF transmitter comprising a digitally controlled oscillator, DCO; and digital modulation circuitry connected to the DCO is provided. The method comprises generating, at the DCO, an RF signal; driving the digital modulation circuitry by an RF clock derived from the RF signal; inputting, at the digital modulation circuitry, symbols for modulation; applying, at the digital modulation circuitry, a compensation for modulation jitter due to the digital modulation circuitry being driven by the RF clock and a compensation for DCO non-linearity; and modulating the RF signal as controlled by the digital modulation circuitry.

The second implementation may generally present the same or corresponding advantages or even different advantages as the first implementation.

BRIEF DESCRIPTION OF THE FIGURES

The above, as well as additional features and advantages will be better understood through the following illustrative and non-limiting detailed description, with reference to the appended drawings.

The figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawing. That which is encompassed by the claims may, however, be embodied in many different forms and should not be construed as limited to the embodiments set forth herein; rather, these embodiments are provided by way of example. Furthermore, like numbers refer to the same or similar elements or components throughout.

I. Example Radio Frequency Transmitter

Figure 1:
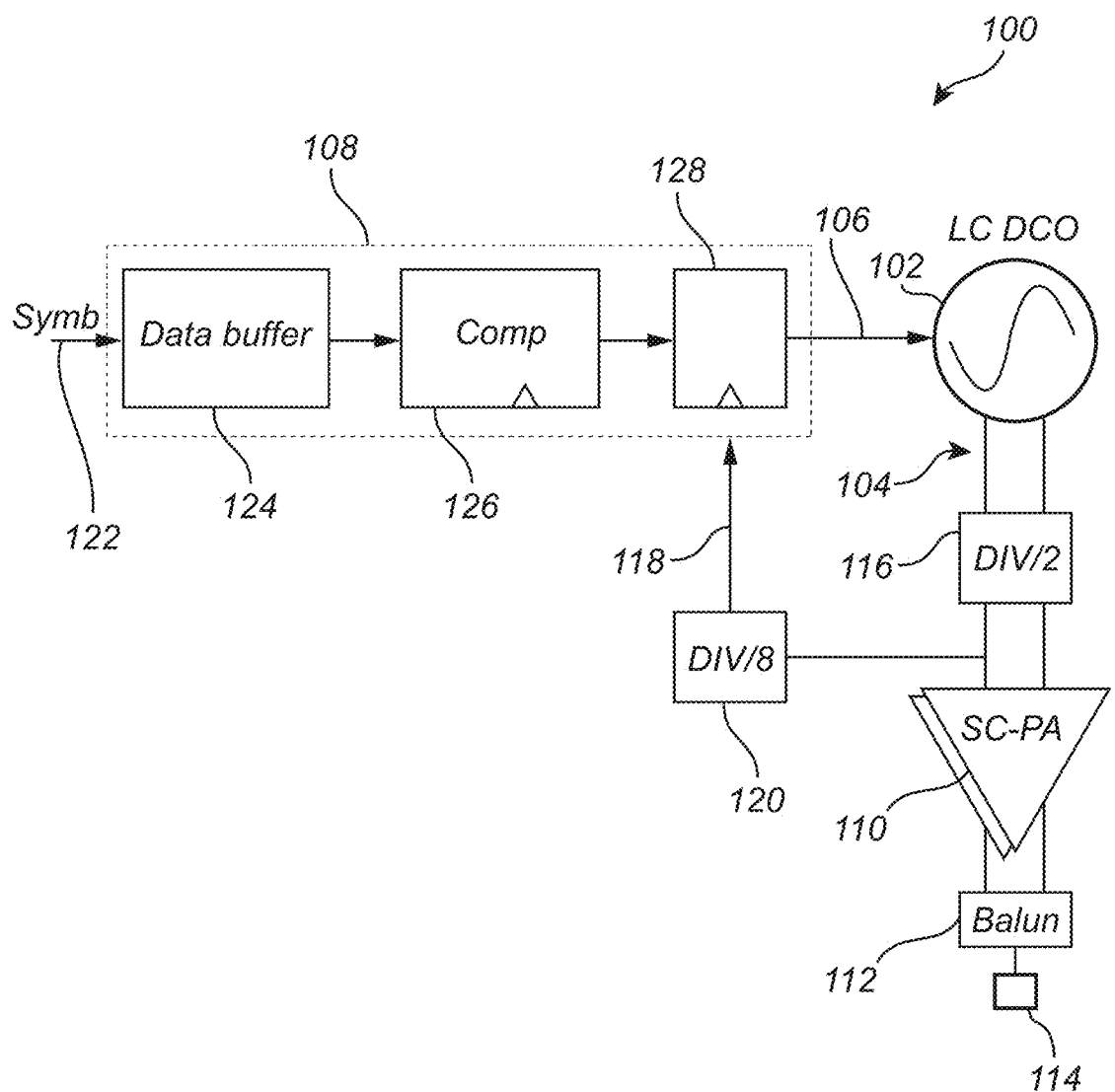
FIG. 1 schematically shows an RF transmitter according to the example implementations.

FIG. 1 schematically shows a radio frequency (RF) transmitter 100.

The RF transmitter 100 comprises a digitally controlled oscillator (DCO) 102. The DCO 102 is configured to generate an RF signal 104. As an example, the DCO 102 comprises a resonant LC circuit (not shown).

The LC circuit comprises one or more inductors having a total inductance L. Furthermore, the LC circuit comprises a plurality of capacitors, having a total capacitance $C_{tot}$, a fraction which may be switched into or out of the LC circuit for controlling the frequency of the RF signal 104 output by the DCO 102.

Due to the inherent properties of the LC oscillator, the frequency of the RF signal 104 output by the DCO 102 is related to the total inductance L and the total capacitance $C_{tot}$ of the LC circuit as $$F_{out} = \frac{1}{2\pi\sqrt{LC_{tot}}}.$$

Thus, the RF signal 104 frequency $F_{out}$ exhibits a non-linear relationship to the LC circuit capacitance $C_{tot}$.

For simplicity, in this example, the capacitors of the LC circuit are represented as a base capacitance C, with a plurality of switchably connectable capacitors each having a capacitance dC, where an integer m, which may be positive, zero, or negative, represents the switchably connectable capacitors connected at a given moment, with the total capacitance in the LC circuit being $C_{tot} = C + m\ dC.$ Typically, m=0 may represent half of the switchably connectable capacitors being connected.

The frequency of the RF signal 104 output by the DCO 102 then becomes $$F_{out} = \frac{1}{2\pi\sqrt{L(C+mdC)}}.$$

For controlling the RF frequency output by the DCO 102, the DCO 102 comprises a control input 106, which may be a capacitor control code, i.e., a digital code indicating how capacitors should be switched into the LC circuit.

For controlling of modulation of the RF signal 104 output by the DCO 102, the RF transmitter 100 comprises digital modulation circuitry 108 connected to the DCO 102.

The digital modulation circuitry 108 comprises an input 122 for inputting modulation data in the form of symbols for modulation.

The input is connected to a data buffer 124 comprised in the digital modulation circuitry 108 for buffering data to be modulated.

Further, the digital modulation circuitry 108 comprises a compensation block 126 for compensating for LC non-linearity and modulation jitter, as will be described in detail below. The compensation block 126 is connected to the data buffer 124 for receiving modulation symbols to be modulated and to a modulation block 128.

The modulation block 128, comprised in the digital modulation circuitry 108, converts the digital modulation symbols to the control input 106 of the DCO 102.

The RF signal 104 generated by the DCO 102 may, as shown in the figure, be output to a power amplifier 110, for example a switched-capacitor power amplifier, through a factor-of-2 frequency divider 116. The power amplifier 110 may in turn output the signal, after amplification, to a load 114, for example an antenna, through a balun 112.

The digital modulation circuitry 108 is driven, i.e., clocked, by an RF clock signal 118 derived from the RF signal 104 generated by the DCO 102. For example, as shown in FIG. 1, the output of the factor-of-2 frequency divider 116 may be input to a further factor-of-8 frequency divider 120, with the output of the factor-of-8 frequency divider 120 input to the digital modulation circuitry 108. Though further dividers (not shown) different parts of the digital modulation circuitry 108 may comprise different respective clock domains driven by clock signals operating at different fractions of the frequency of the of the RF signal 104.

For example, the digital modulation circuitry 108 may be configured for polar modulation of the RF signal 104, for example OFDM modulation.

In the example of FIG. 1, the DCO 102 operates at an approximate frequency of 4.8 gigahertz (GHz). Through the factor-of-2 frequency divider 116, the transmitted signal has an approximate frequency of 2.4 GHz and through the further factor-by-8 frequency divider 120, the digital modulation circuitry 108 is driven, i.e., clocked at a frequency of 300 MHz.

The digital modulation circuitry 108 may oversample the RF signal 104 to be modulated. For example, for an oversampling factor of 10, the modulation data symbol rate will be 30 MHz.

Through the digital modulation circuitry 108 being driven by the RF clock signal 118 derived from RF signal 104 generated by the DCO 102, modulation data is input into the DCO 102 with the RF clock signal 118 which is derived from the DCO 102 itself. This means that when the RF signal 104 frequency generated by the DCO 102 goes up, the digital modulation data is input faster into the DCO 102 and when the RF signal 104 frequency generated by the DCO 102 goes down, the data is clocked slower into the DCO 102. In other words, the digital modulation data is clocked into the DCO 102 with a speed dependent on the content of the data, resulting in modulation jitter.

The compensation block in the digital modulation circuitry 108 is configured to apply both a compensation for this modulation jitter due to the digital modulation circuitry 108 being driven by the RF clock signal 118 and a compensation for DCO 102 non-linearity.

In at least some implementations, the compensation for modulation jitter and the compensation for DCO 102 non-linearity may thus be applied in a single block, i.e., in a single circuit module without any intervening circuitry.

Further, the compensation for modulation jitter and the compensation for DCO 102 non-linearity may be applied in a single step, or, alternatively in sequence.

The compensation is applied to the control input 106 of the DCO 102.

A compensation factor to the frequency control of the DCO 102 for compensating for modulation jitter may be derived as follows.

A modulation phase advance delta per clock cycle of the RF clock signal 118 driving the digital modulation circuitry 108 can be written:

$$\partial \varphi_{ideal} = \frac{2\pi F_{control} N}{F_{RF}}$$

where $F_{RF}$ is a nominal RF frequency for the DCO 102 and $F_{control}$ is a deviation from the nominal RF frequency to which the DCO 102 is modulated, i.e. the actual, modulated frequency of the DCO 102 is $$F_{modulated} = F_{RF} + F_{control},$$

and N is a division factor between the frequency of the RF signal 104 generated by the DCO 102 and the frequency of the RF clock signal 118, as determined by the factor-of-2 frequency divider 116 and the factor-of-8 frequency divider 120.

However, since the RF clock signal 118 driving the digital modulation circuitry 108 is derived from the RF signal 104 generated by the DCO 102, the actual phase advance per clock cycle of the RF clock signal 118 driving the digital modulation circuitry 108 is:

$$\partial \varphi_{actual} = \frac{2\pi F_{control} N}{F_{modulated}} = \frac{2\pi F_{control} N}{F_{RF} + F_{control}}$$

Applying a compensation factor α to $F_{conotrol}$, substituting $$F_{control} \rightarrow \alpha F_{control},$$

$\partial \varphi_{actual}$ becomes $$\partial \varphi_{actual} = \frac{2\pi \alpha F_{control} N}{F_{RF} + \alpha F_{control}}.$$

Setting $$\partial \varphi_{acutal} = \partial \varphi_{ideal}$$

and solving for α yields a frequency compensation factor $$\alpha = \frac{F_{RF}}{F_{RF} - F_{control}}.$$

A compensation factor to the frequency control of the DCO 102 for compensating both for modulation jitter and LC circuit non-linearity may be derived as follows.

As noted above, the frequency of the RF signal 104 generated by the DCO 102 has a non-linear relationship to the connected capacitors m, $$F_{out} = \frac{1}{2\pi\sqrt{L(C + mdC)}}.$$

Desirably, the frequency of the should be controllable as m times a fixed frequency step dF:

$$F_{ideal} = F_{RF} + \alpha(m) m \, dF,$$

where α(m) is a compensation for modulation jitter as derived above:

$$\alpha(m) = \frac{F_{RF}}{F_{RF} - mdF}.$$

Applying a compensation factor c(m) to the variable capacitance, substituting $$m \, dC \rightarrow c(m) m \, dC,$$

$F_{out}$ becomes $$F_{out} = \frac{1}{2\pi\sqrt{L(C + c(m)mdC)}}.$$

Setting $$F_{out} = F_{comp}$$

and solving for c(m) yields a capacitance compensation factor, thus compensating for both modulation jitter and DCO 102 non-linearity:

$$c(m) = \frac{1 - 4\pi^2 LC(F_{RF} + \alpha(m)mdF)^2}{4\pi^2 LdCm(F_{RF} + \alpha(m)mdF)^2}.$$

Such a compensation factor may, for example, be stored in a look-up table (LUT) in the digital modulation circuitry 108, or be calculated directly by the digital modulation circuitry 108.

Hereby, a function already present in the compensation block 126 to correct for frequency non-linearity, such as LC non-linearity, may be adapted to correct for modulation jitter as well.

The compensation for DCO non-linearity and the compensation for modulation jitter may work in opposite directions, so that the combined compensation implies not fully linearizing the frequency response of the DCO, with the remaining frequency non-linearity compensated for modulation jitter.

For power efficiency, the compensation may be done at the lowest resolution possible that still meets given EVM requirements. In at least some implementations, the compensation is done as close possible to the final control stage of the DCO, to allow for decreasing complexity and power requirements.

II. Example Operation

Figure 2:
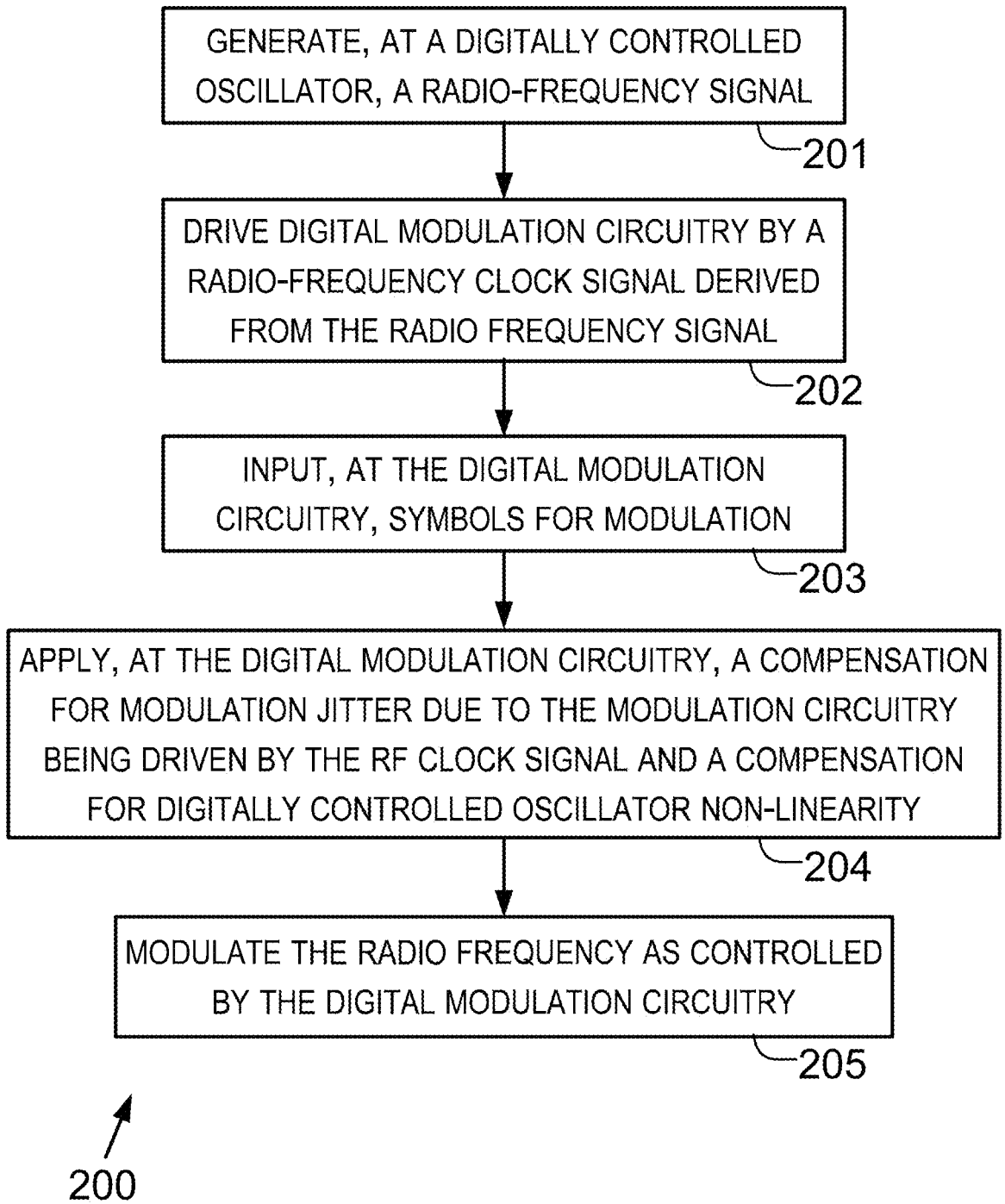
FIG. 2 is a flow chart showing an example method according to the example implementations.

Next, FIG. 2 is a flowchart 200 showing a method of generating a digitally-modulated radio frequency signal, using a radio frequency transmitter. The radio frequency transmitter comprises a digitally controlled oscillator, and digital modulation circuitry connected to the digitally controlled oscillator.

Block 201 includes generating, at the digitally controlled oscillator, a radio frequency signal.

Next, block 202 includes driving the digital modulation circuitry by a radio frequency clock derived from the radio frequency signal.

Next, block 203 includes inputting, at the digital modulation circuitry, symbols for modulation.

Next, block 204 includes applying, at the digital modulation circuitry, a compensation for modulation jitter due to the digital modulation circuitry being driven by the radio frequency clock and a compensation for digitally controlled oscillator non-linearity.

Next block 205 includes modulating the radio frequency signal as controlled by the digital modulation circuitry.

III. Example Implementations

Example implementation 1 is a radio frequency, RF, transmitter (100), comprising: a digitally controlled oscillator, DCO (102), configured to generate an RF signal (104); and digital modulation circuitry (108) connected to said DCO (102) for modulation of said RF signal (104), and driven by an RF clock signal (118) derived from said RF signal (104). The digital modulation circuitry (108) comprises a module (126) configured to apply a compensation for modulation jitter due to said modulation circuitry being driven by said RF clock signal and a compensation for DCO non-linearity.

Example implementation 2 is an RF transmitter according to example implementation 1, wherein said compensation for modulation jitter and said compensation for DCO non-linearity are applied to a capacitor control (106) of said DCO (102).

Example implementation 3 is an RF transmitter according to example implementation 2, wherein said compensation for modulation jitter can be written as a frequency compensation factor $$\alpha = \frac{F_{RF}}{F_{RF} - F_{control}}.$$

$F_{RF}$ is a nominal RF frequency for said DCO (102) and F control is a deviation from said nominal RF frequency to which said DCO (102) is modulated.

Example implementation 4 is an RF transmitter (100) according to any one of example implementations 1-3, wherein said compensation for modulation jitter and said compensation for DCO non-linearity are applied in a single step.

Example implementation 5 is an RF transmitter (100) according to any one of example implementations 1-4, wherein said DCO non-linearity comprises an LC non-linearity.

Example implementation 6 is an RF transmitter (100) according to any one of example implementations 4-5, wherein said compensation for modulation jitter and said compensation for DCO non-linearity can be written as a capacitance compensation factor $$c(m) = \frac{1 - 4\pi^2 LC(F_{RF} + \alpha(m)mdF)^2}{4\pi^2 LdCm(F_{RF} + \alpha(m)mdF)^2},$$

wherein $$\alpha(m) = \frac{F_{RF}}{F_{RF} - mdF}.$$

$F_{RF}$ is a nominal RF frequency for said DCO (102), m represents a number of connected capacitors, L is a DCO LC circuit inductance, C is a DCO LC circuit capacitance, dC is a switchably connectable capacitance, and dF is a fixed frequency step.

Example implementation 7 is an RF transmitter (100) according to example implementation 3, wherein said capacitor control is a capacitor control code of said DCO (102).

Example implementation 8 is an RF transmitter (100) according to any one of example implementations 1-7, wherein said digital modulation circuitry (108) is configured for polar modulation of said RF signal.

Example implementation 9 is an RF transmitter (100) according to any one of example implementations 1-8, wherein said digital modulation circuitry oversamples said RF signal to be modulated.

Example implementation 10 is a method of generating a digitally-modulated a radio frequency, RF, signal (104), using an RF transmitter (100) comprising: a digitally controlled oscillator, DCO (102); and digital modulation circuitry (108) connected to said DCO (102). The method comprises: (i) generating, at said DCO (102), an RF signal (104); (ii) driving said digital modulation circuitry (108) by an RF clock signal (118) derived from said RF signal (104); (iii) inputting, at said modulation circuitry (108), symbols for modulation; (iv) applying, at said digital modulation circuitry (108), a compensation for modulation jitter due to said modulation circuitry being driven by said RF clock signal (104) and a compensation for DCO non-linearity; and
(v) modulating said RF signal (104) as controlled by said digital modulation circuitry (108).

IV. Conclusion

The example implementations and embodiments have mainly been described with reference to a limited number of examples. However, as is readily appreciated by a person skilled in the art, other examples than the ones disclosed above are equally possible within the scope of this description. While some embodiments have been illustrated and described in detail in the appended drawing and the foregoing description, such illustration and description are to be considered illustrative and not restrictive. Other variations to the disclosed embodiments can be understood and effected in practicing the claims, from a study of the drawing, the disclosure, and the appended claims. The mere fact that certain measures or features are recited in mutually different dependent claims does not indicate that a combination of these measures or features cannot be used.

What is claimed is:

1. A radio frequency, RF, transmitter, comprising:
    a digitally controlled oscillator, DCO, configured to generate an RF signal; and
    digital modulation circuitry connected to the DCO for modulation of the RF signal, and driven by an RF clock signal derived from the RF signal,
    wherein the digital modulation circuitry is configured to apply a compensation for modulation jitter due to the digital modulation circuitry being driven by the RF clock signal and a compensation for DCO non-linearity, and
    wherein the compensation for modulation jitter and the compensation for DCO non-linearity are applied to a capacitor control of the DCO.

2. A radio frequency transmitter according to claim 1, wherein the compensation for modulation jitter can be written as a frequency compensation factor $$\alpha = \frac{F_{RF}}{F_{RF} - F_{control}},$$

wherein $F_{RF}$ is a nominal RF frequency for the DCO and $F_{control}$ is a deviation from the nominal RF frequency to which the DCO is modulated.

3. A radio frequency transmitter according to claim 2, wherein the compensation for modulation jitter and the compensation for DCO non-linearity are applied in a single step.

4. A radio frequency transmitter according to claim 3, wherein the DCO non-linearity comprises an LC non-linearity.

5. A radio frequency transmitter according to claim 3, wherein the compensation for modulation jitter and the compensation for DCO non-linearity can be written as a capacitance compensation factor $$c(m) = \frac{1 - 4\pi^2 LC(F_{RF} + \alpha(m)mdF)^2}{4\pi^2 LdCm(F_{RF} + \alpha(m)mdF)^2},$$

wherein $$\alpha(m) = \frac{F_{RF}}{F_{RF} - mdF},$$

wherein $F_{RF}$ is a nominal RF frequency for the DCO, m represents a number of connected capacitors, L is a DCO LC circuit inductance, C is a DCO LC circuit capacitance, dC is a switchably connectable capacitance, and dF is a fixed frequency step.

6. A radio frequency transmitter according to claim 2, wherein the DCO non-linearity comprises an LC non-linearity.

7. A radio frequency transmitter according to claim 2, wherein the capacitor control is a capacitor control code of the DCO.

8. A radio frequency transmitter according to claim 1, wherein the compensation for modulation jitter and the compensation for DCO non-linearity are applied in a single step.

9. A radio frequency transmitter according to claim 8, wherein the DCO non-linearity comprises an LC non-linearity.

10. A radio frequency transmitter according to claim 8, wherein the compensation for modulation jitter and the compensation for DCO non-linearity can be written as a capacitance compensation factor $$c(m) = \frac{1 - 4\pi^2 LC(F_{RF} + \alpha(m)mdF)^2}{4\pi^2 LdCm(F_{RF} + \alpha(m)mdF)^2},$$

wherein $$\alpha(m) = \frac{F_{RF}}{F_{RF} - mdF},$$

wherein $F_{RF}$ is a nominal RF frequency for the DCO, m represents a number of connected capacitors, L is a DCO LC circuit inductance, C is a DCO LC circuit capacitance, dC is a switchably connectable capacitance, and dF is a fixed frequency step.

11. A radio frequency transmitter according to claim 1, wherein the DCO non-linearity comprises an LC non-linearity.

12. A radio frequency transmitter according to claim 11, wherein the compensation for modulation jitter and the compensation for DCO non-linearity can be written as a capacitance compensation factor $$c(m) = \frac{1 - 4\pi^2 LC(F_{RF} + \alpha(m)mdF)^2}{4\pi^2 LdCm(F_{RF} + \alpha(m)mdF)^2},$$

wherein $$\alpha(m) = \frac{F_{RF}}{F_{RF} - mdF},$$

wherein $F_{RF}$ is a nominal RF frequency for the DCO, m represents a number of connected capacitors, L is a DCO LC circuit inductance, C is a DCO LC circuit capacitance, dC is a switchably connectable capacitance, and dF is a fixed frequency step.

13. A radio frequency transmitter according to claim 12, wherein the compensation for modulation jitter and the compensation for DCO non-linearity are applied in a single step.

14. A radio frequency transmitter according to claim 13, wherein the DCO non-linearity comprises an LC non-linearity.

15. A radio frequency transmitter according to claim 14, wherein the compensation for modulation jitter and the compensation for DCO non-linearity can be written as a capacitance compensation factor $$c(m) = \frac{1 - 4\pi^2 LC(F_{RF} + \alpha(m)mdF)^2}{4\pi^2 LdCm(F_{RF} + \alpha(m)mdF)^2},$$

wherein $$\alpha(m) = \frac{F_{RF}}{F_{RF} - mdF},$$

wherein $F_{RF}$ is a nominal RF frequency for the DCO, m represents a number of connected capacitors, L is a DCO LC circuit inductance, C is a DCO LC circuit capacitance, dC is a switchably connectable capacitance, and dF is a fixed frequency step.

16. A radio frequency transmitter according to claim 13, wherein the compensation for modulation jitter and the compensation for DCO non-linearity can be written as a capacitance compensation factor $$c(m) = \frac{1 - 4\pi^2 LC(F_{RF} + \alpha(m)mdF)^2}{4\pi^2 LdCm(F_{RF} + \alpha(m)mdF)^2},$$

wherein $$\alpha(m) = \frac{F_{RF}}{F_{RF} - mdF},$$

wherein $F_{RF}$ is a nominal RF frequency for the DCO, m represents a number of connected capacitors, L is a DCO LC circuit inductance, C is a DCO LC circuit capacitance, dC is a switchably connectable capacitance, and dF is a fixed frequency step.

17. A radio frequency transmitter according to claim 1, wherein the digital modulation circuitry is configured for polar modulation of the RF signal.

18. A radio frequency transmitter according to claim 1, wherein the digital modulation circuitry is configured to oversample the RF signal to be modulated.

19. A radio frequency transmitter according to claim 1, wherein the radio frequency transmitter includes a wideband polar orthogonal frequency division multiplex (OFDM) radio frequency transmitter.

20. A radio frequency transmitter according to claim 1, wherein the digital modulation circuitry includes a frequency linearization module to apply the compensation for modulation jitter due to the digital modulation circuitry being driven by the RF clock signal and the compensation for DCO non-linearity.

21. A radio frequency transmitter according to claim 1, wherein the compensation for DCO non-linearity and the compensation for modulation jitter work in opposite directions.

22. A radio frequency transmitter according to claim 1, wherein the compensation for modulation jitter and the compensation for DCO non-linearity are applied in a sequence.

23. A method of generating a digitally-modulated radio frequency, RF, signal, using an RF transmitter comprising:
a digitally controlled oscillator, DCO; and
digital modulation circuitry connected to the DCO,
the method comprising:
generating, at the DCO, an RF signal;
driving the digital modulation circuitry by an RF clock signal derived from the RF signal;
inputting, at the digital modulation circuitry, symbols for modulation;
applying, at the digital modulation circuitry, a compensation for modulation jitter due to the digital modulation circuitry being driven by the RF clock signal and a compensation for DCO non-linearity; and
modulating the RF signal as controlled by the digital modulation circuitry,
wherein the compensation for modulation jitter and the compensation for DCO non-linearity are applied to a capacitor control of the DCO.

* * * * *